US009204585B2

(12) United States Patent
Saunders et al.

(10) Patent No.: US 9,204,585 B2
(45) Date of Patent: *Dec. 1, 2015

(54) CONFIGURATIONS OF APERTURES IN A MINIATURE ELECTRONIC COMPONENT CARRIER MASK

(71) Applicant: Electro Scientific Industries, Inc., Portland, OR (US)

(72) Inventors: William J. Saunders, Tigard, OR (US); Douglas J. Garcia, Beaverton, OR (US); Nick A. Tubbs, Beaverton, OR (US); Gerald F. Boe, Newberg, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 103 days.

This patent is subject to a terminal disclaimer.

(21) Appl. No.: 14/148,417

(22) Filed: Jan. 6, 2014

(65) Prior Publication Data

US 2014/0116922 A1    May 1, 2014

Related U.S. Application Data

(60) Continuation of application No. 13/624,697, filed on Sep. 21, 2012, now Pat. No. 8,622,218, which is a division of application No. 11/090,958, filed on Mar. 25, 2005, now abandoned.

(51) Int. Cl.
*B65D 85/00* (2006.01)
*H05K 13/00* (2006.01)

(52) U.S. Cl.
CPC ....... *H05K 13/0084* (2013.01); *Y10T 29/49121* (2015.01)

(58) Field of Classification Search
CPC ............. H05K 13/0084; Y10T 29/49121
USPC ......... 206/716, 713, 330, 460, 320, 206, 231, 206/338
See application file for complete search history.

(56) References Cited

U.S. PATENT DOCUMENTS

| | | | | | |
|---|---|---|---|---|---|
| 4,099,615 | A | * | 7/1978 | Lemke et al. | 206/716 |
| 5,007,534 | A | * | 4/1991 | Tamaki et al. | 206/722 |
| 5,226,382 | A | * | 7/1993 | Braden | 118/406 |
| 5,996,985 | A | * | 12/1999 | Balz et al. | 269/48.1 |
| 6,216,419 | B1 | * | 4/2001 | Sakurai | 206/713 |
| 6,442,825 | B1 | * | 9/2002 | Pomerantz | 29/558 |
| 6,919,532 | B2 | * | 7/2005 | Swenson et al. | 219/121.69 |
| 7,243,776 | B2 | * | 7/2007 | Whiteman et al. | 198/345.3 |
| 2002/0017240 | A1 | * | 2/2002 | Obana et al. | 118/712 |
| 2004/0011700 | A1 | * | 1/2004 | Brahmbhatt et al. | 206/713 |
| 2004/0094450 | A1 | * | 5/2004 | Whiteman et al. | 206/701 |

* cited by examiner

*Primary Examiner* — Chun Cheung
(74) *Attorney, Agent, or Firm* — Stoel Rives LLP (57) ABSTRACT

A miniature component carrier includes a thin, resilient mask through which are formed multiple spaced-apart apertures each of which is sized and shaped to compliantly receive and hold a miniature component in a controlled orientation during termination processing such that the side margins of the aperture primarily contact and grip the corner regions of the miniature component. At least some of the apertures have side margins that form rhomboidal or elliptical apertures. The shape and size of the multiple spaced-apart apertures confine within an operational tolerance contact between the side margins of the aperture and the side or end wall surfaces of the electronic component. This reduces mechanical damage to the side and end wall surfaces that results from their contact with the side margins during receipt and gripping of the miniature component in the aperture.

20 Claims, 8 Drawing Sheets

CONFIGURATIONS OF APERTURES IN A MINIATURE ELECTRONIC COMPONENT CARRIER MASK

RELATED APPLICATIONS

This is a continuation of U.S. patent application Ser. No. 13/624,697, filed Sep. 21, 2012, now U.S. Pat. No. 8,622,218, which is a division of U.S. patent application Ser. No. 11/090,958, filed Mar. 25, 2005, abandoned.

COPYRIGHT NOTICE

© 2014 Electro Scientific Industries, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR §1.71 (d).

TECHNICAL FIELD

This disclosure relates to a carrier for miniature components and, in particular, to a miniature component carrier having dimensionally precise slots shaped to grip the corners of a miniature electronic component and hold it in a controlled orientation without damaging the electrically conductive portions of the electronic component.

BACKGROUND INFORMATION

Computers and other electronic equipment are becoming more powerful and can perform a wider range of tasks. These increases in power and applicability result at least in part from an increase in the number of miniature electronic components included in each computer or other piece of electronic equipment. To help minimize the sizes of the computers and other electronic equipment and to facilitate their operation at higher speeds, electronic circuits used in computers and other electronic equipment include miniature electronic components positioned in high density packing arrangements.

Figure 1:
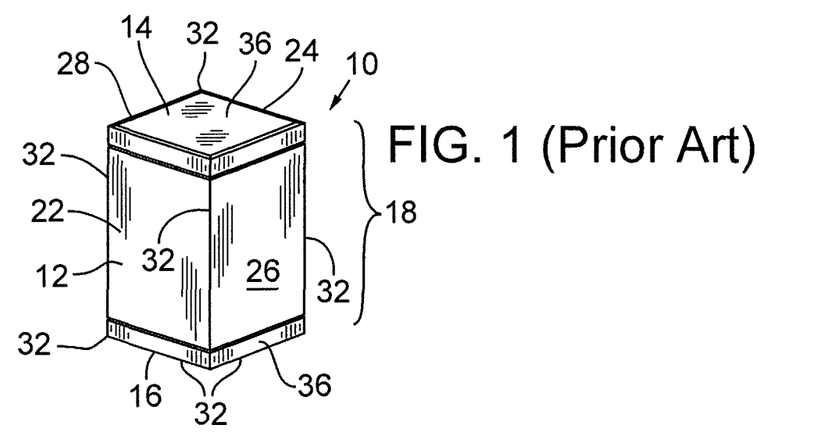
FIG. 1 is an enlarged isometric pictorial view of a capacitor chip.

One such miniature electronic component, a solid state capacitor, is a tiny rectangular "chip" that is smaller than a grain of rice. FIG. 1 shows a capacitor chip 10 that has a solid enclosed body 12 of square or rectangular cross section and made of ceramic or other dielectric material. Body 12 includes opposed upper and lower surfaces 14 and 16 spaced apart by a body thickness 18 and bound by opposed side wall surfaces 22 and 24 and opposed end wall surfaces 26 and 28. The linear region along which two edges of any of the surfaces (e.g., upper, lower, side wall, or end wall surfaces) meet and form an angle is called a corner region 32. Capacitor chip 10 includes multiple linear corner regions 32, such as, for example, (1) corner regions 32 defined by the intersection of an edge of upper surface 14 with an edge of one of side wall surfaces 22 and 24 or one of end wall surfaces 26 and 28, (2) corner regions 32 defined by the intersection of an edge of lower surface 16 with an edge of one of side wall surfaces 22 and 24 or one of end wall surfaces 26 and 28, and (3) corner regions 32 defined by the intersection of an edge of one of side wall surfaces 22 and 24 with an edge of one of end wall surfaces 26 and 28. Linear corner regions 32 may also include the point at which three edges meet, such as, for example, the point at which an edge of upper surface 14 meets with an edge of each of side wall surface 22 and end wall surface 26.

Capacitor chip 10 contains within body thickness 18 multiple spaced-apart metal plates (not shown). One terminal end of each of alternate metal plates is connected to the exterior of body 12 and is adapted by a metallizing process to form a pair of spaced-apart mutually opposed electronic contact surfaces or ends 36. One or more of contact surfaces 36 of capacitor chip 10 are striped with a solderable paste that is dried and then fired to produce surfaces that can later be soldered directly onto a circuit board. This process is commonly referred to as "termination." U.S. Pat. No. 5,226,382 describes a machine for placing a stripe or trace of solderable paste on the contact surfaces of a chip and drying the paste so that the paste can later be fired. This machine uses a metal carrier belt or tape in which slotted rubber masks are formed. Apertures in the masks receive chips in position for processing, such as covering opposed ends of the chips with solderable paste.

A relatively new miniature electronic component, an integrated passive component (IPC) or array chip, is composed of multiple circuit components fit into a single array chip that is simultaneously solderable to one of a number of different electronic circuits. This device is called an "array chip" because it comprises a plurality or an array of circuit components, such as four or five separate capacitors stacked together in a single chip. U.S. Pat. No. 5,863,331 describes a machine for placing stripes of solderable paste on the contact surfaces of a chip array.

Figure 2A:
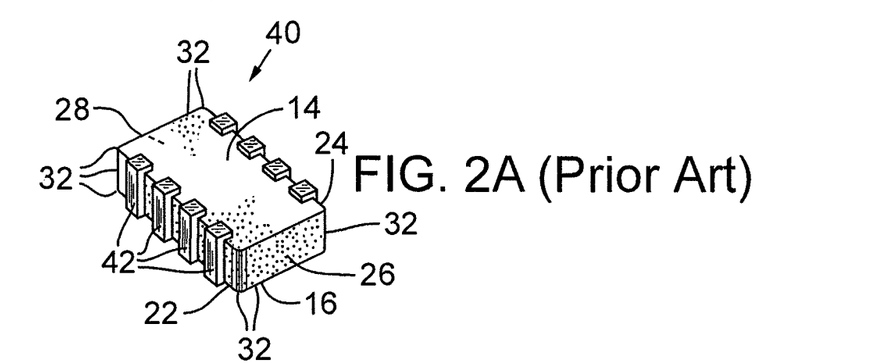
FIG. 2A is an enlarged isometric pictorial view of a typical integrated passive component or array chip coated with solderable paste.

FIG. 2A shows a typical array chip 40 with its side wall surfaces 22 and 24 covered with stripes 42 of solderable paste. Optionally, end wall surfaces 26 and 28 may be covered with stripes 42 of solderable paste (not shown). Array chip 40 has overall dimensions such as 3.2 mm (0.125 in) long and 1.5 mm (0.060 in) wide upper and lower surfaces 14 and 16; 1.5 mm (0.060 in) wide and 0.8 mm (0.031 in) high opposed end wall surfaces 26 and 28; and 0.8 mm (0.031 in) high and 3.2 mm (0.125 in) long opposed side wall surfaces 22 and 24. Where both end wall surfaces and side wall surfaces include stripes 42 of solderable paste, formation of stripes 42 on end wall surfaces 26 and 28 may occur before or after formation of stripes 42 on side wall surfaces 22 and 24.

Figure 2B:
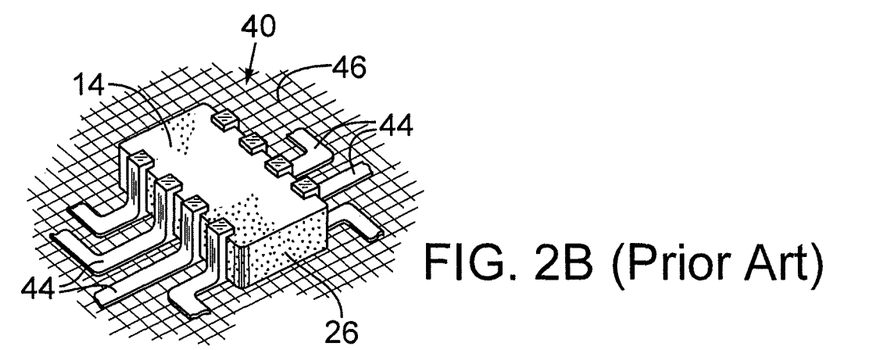
FIG. 2B is an enlarged isometric pictorial view of the array chip of FIG. 2A mounted on a surface of a circuit board.

FIG. 2B shows that installing array chip 40 into an electronic circuit entails placing separate solderable paste stripes 42 along opposite wall surfaces, such as side wall surfaces 22 and 24 (as shown) or end wall surfaces 26 and 28 (not shown), and soldering paste stripes 42 to copper traces 44 formed on a circuit board 46. The width of each stripe 42 is typically set at 0.38±0.18 mm (0.015±0.007 in), with a 0.3±0.18 mm (0.012±0.007 in) turn-down edge at the end of each stripe 42 along the adjacent wall as shown on respective upper and lower surfaces 14 and 16 in FIG. 2A. As with other electronic components, after the paste is applied, it is subjected to a heat-drying cycle to set the paste and thereafter to a firing cycle to fuse the paste on array chip 40.

The small size of an array chip and the small differences between its width and height dimensions raise the importance of handling the array chip and its insertion into the mask of a carrier belt or tape. The multiple stripes are placed on only the appropriate circuit board surfaces, and their placement is accomplished with extreme accuracy. Splashing of the paste onto other surfaces of the array chip would provide a site for a short circuit and thereby significantly degrade electronic equipment function. Accordingly, a feed device places the array chip onto the carrier belt in a correct position and location, and the array chip is handled correctly so that the appropriate surface is exposed in proper orientation to receive the paste stripes within a specified accuracy.

Typically, miniature component carriers that transport miniature electronic components and present them for processing include an endless belt or tape that carries multiple miniature electronic components, such as capacitor chips 10 and array chips 40. The endless tape is formed with a plurality of transversely oriented, elongated apertures arranged centrally between and uniformly spaced apart along the marginal edges of the tape. Each of the apertures is adapted to receive in coplanar fixed registration a thin, resilient mask having at least one aperture, and preferably multiple apertures, of a size and shape to compliantly receive and hold the miniature components in a specific orientation so that the surfaces intended for termination extend outwardly from the mask. The term "mask" is used in the art to define an element made of silicone rubber, or other resilient material, that surrounds and partly encloses an electronic component during some stage of its fabrication process. The purpose of a mask is to provide a generally elongated, resilient-walled holder in which an electronic component may be temporarily held during the process of metallizing its opposite ends.

Figure 3:
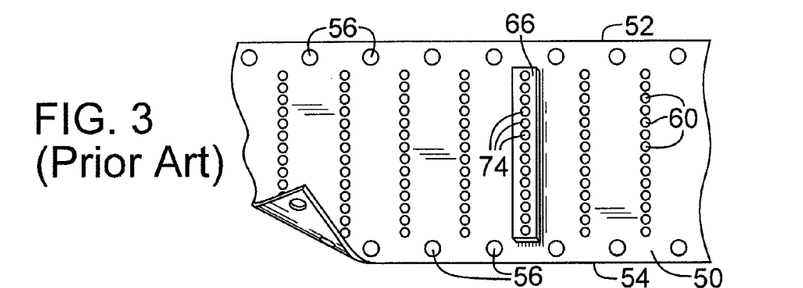
FIG. 3 is a fragmentary top plan view of a component carrier tape in which a series of apertures carries masks that hold electronic components.
Figure 4:
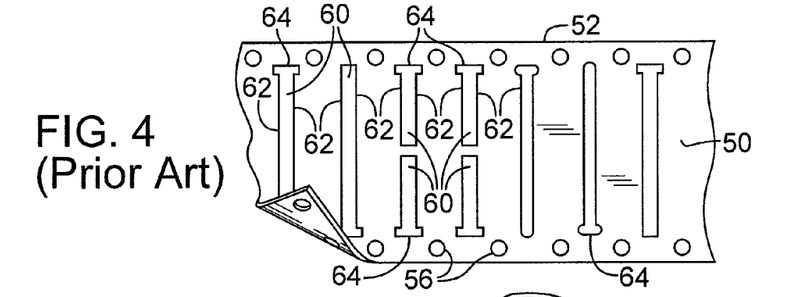
FIG. 4 is a fragmentary plan view showing a carrier tape having a variety of different apertures.
Figure 5:
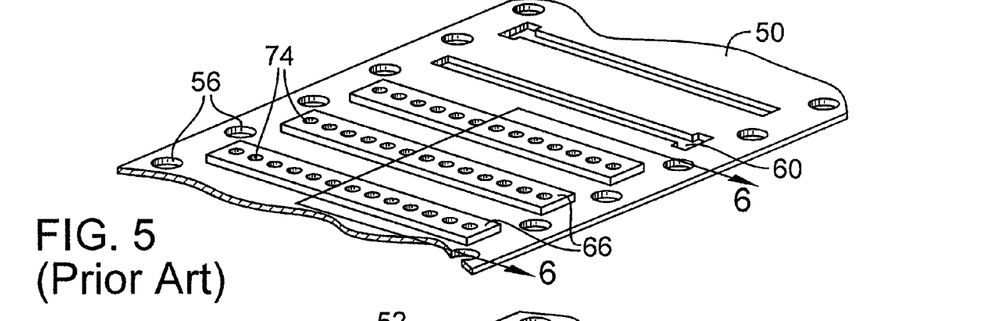
FIG. 5 is a fragmentary isometric view of a carrier tape carrying masks that are formed over the apertures.
Figure 6:
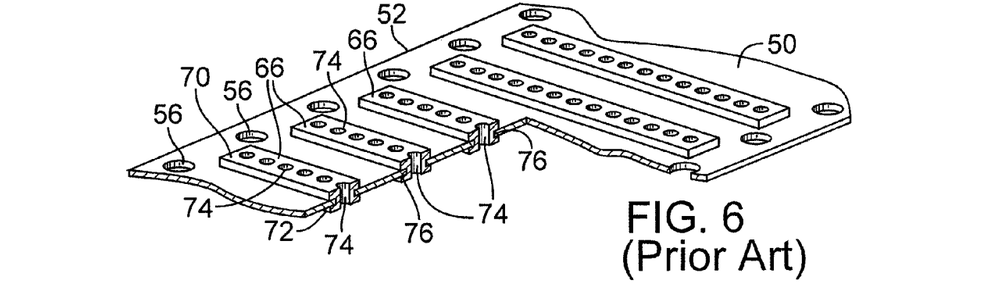
FIG. 6 is a sectional view of the carrier tape and masks taken along lines 6-6 in FIG. 5.

FIG. 3 shows an exemplary endless belt-type component carrier having a flexible metal tape 50 formed of stainless steel or other high-strength metal. Tape 50 is approximately 0.13 mm (0.005 in) thick and about 5.1 cm (2.0 in) wide and is of an "endless" variety in that it has no beginning or end but is maneuvered about a series of pulleys and sprocket wheels between various processing stations, as is described in U.S. Pat. No. 5,226,382. Tape 50 is defined by multiple spaced-apart, mutually parallel side margins 52 and 54 and includes a series of pilot or sprocket holes 56 that serve as drive perforations to receive drive stubs of drive sprocket wheels (not shown). Sprocket holes 56 are disposed adjacent to at least one and preferably both of side margins 52 and 54 and are uniformly spaced along the length of tape 50.

As shown in FIGS. 3-6, tape 50 is formed with a variety of first apertures 60 of different shape and size into which a thin, resilient mask 66 can be inserted. Each of first apertures 60 is adapted to receive in coplanar fixed registration mask 66, which includes one or more second apertures 74 and preferably a series of second apertures 74 of sizes and shapes to compliantly receive multiple electronic components in specific orientation so that their end surfaces intended for termination extend outwardly from mask 66.

First apertures 60 are preferably formed in discrete patterns and are preferably spaced centrally between and uniformly along the marginal edges of tape 50. First apertures 60 are typically a series of closely spaced round openings as shown in FIG. 3, a series of elongated rectangular openings as shown in the end portions of FIG. 4, or a series of elongated openings in repeated patterns in a side-by-side arrangement as shown in the center portion of FIG. 4. In a configuration of other than round holes, first apertures 60 are generally defined by a pair of spaced-apart, elongated side edges 62 bound by a pair of short-end edges 64. Each of first apertures 60 receives a mask 66 that is of a size and shape to remain fixed to tape 50 and to carry multiple electronic components.

Figures 7A, 7B:
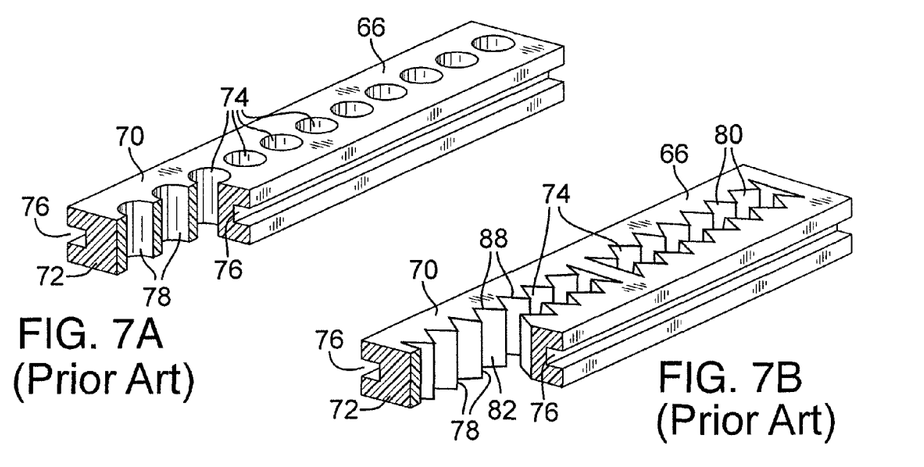
FIGS. 7A and 7B are fragmentary isometric views of two exemplary patterns of apertures formed through the masks of FIG. 6 for carrying electronic components.

Mask 66 is preferably formed of silicone rubber, but may be formed of any conventional elastomeric material having sufficient elasticity to receive and grip a miniature component in a controlled orientation. FIGS. 7A and 7B show that mask 66 is defined by a pair of spaced-apart top and bottom exterior surfaces 70 and 72 that, when mask 66 is fixed in place on tape 50, lie coplanar with and, respectively, above and below the surfaces of tape 50. In its simplest form, shown in FIG. 3, each mask 66 is cast in place about a first aperture 60 so that a plurality of masks 66 may be arranged in a pattern parallel or transverse to the longitudinal axis of tape 50. One or more second apertures 74 of a size smaller than that of first aperture 60 are formed in each mask 66 to keep the metal core of tape 50 out of contact with the electronic component. The size of second apertures 74 is slightly smaller than that of the electronic component in at least one direction so that the electronic component can be positionally accepted and resistively grasped during advancement of the electronic component from one processing stage to another. Mask 66 is defined by, in addition to respective top and bottom surfaces 70 and 72, a pair of opposed elongated slots 76 positioned intermediate of respective top and bottom surfaces 70 and 72 for receipt of elongated side edges 62 of first aperture 60 formed in tape 50. The length of removable mask 66 is less than the width of tape 50 and is preferably less than the distance between adjacent sprocket holes 56.

Figure 8A:
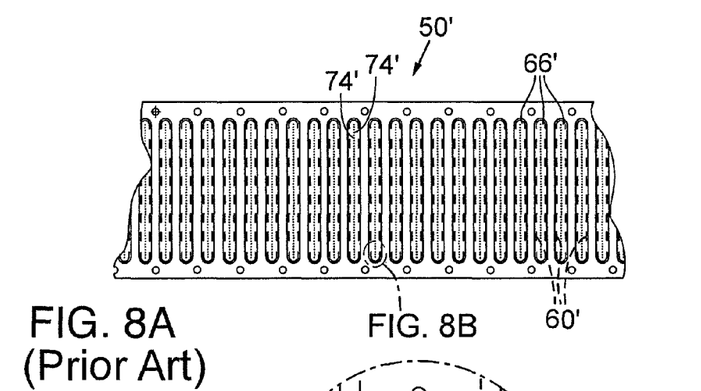
FIG. 8A is a plan view of an alternative type of carrier tape to that of the carrier tape of FIG. 3.
Figure 8B:
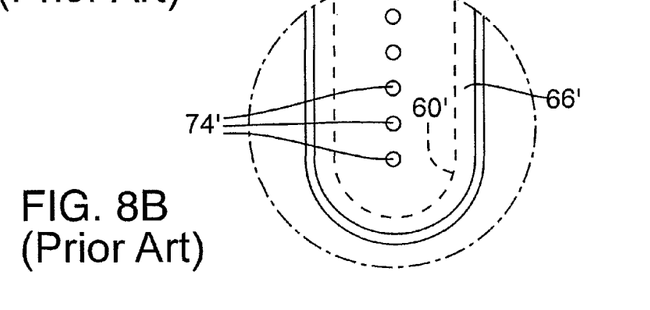
FIG. 8B is an enlarged fragmentary view of the component-holding apertures in the mask strips of the carrier tape of FIG. 8A.

FIGS. 8A and 8B are, respectively, plan and enlarged fragmentary views of an alternative component carrier tape 50' that is similar to tape 50, with the exception that silicone rubber masks 66' molded into or coated over first apertures 60' are of generally rectangular shape with curved ends in a core portion. Second apertures 74' are formed in a single row in each mask 66' along the width of carrier tape 50'.

Figure 9:
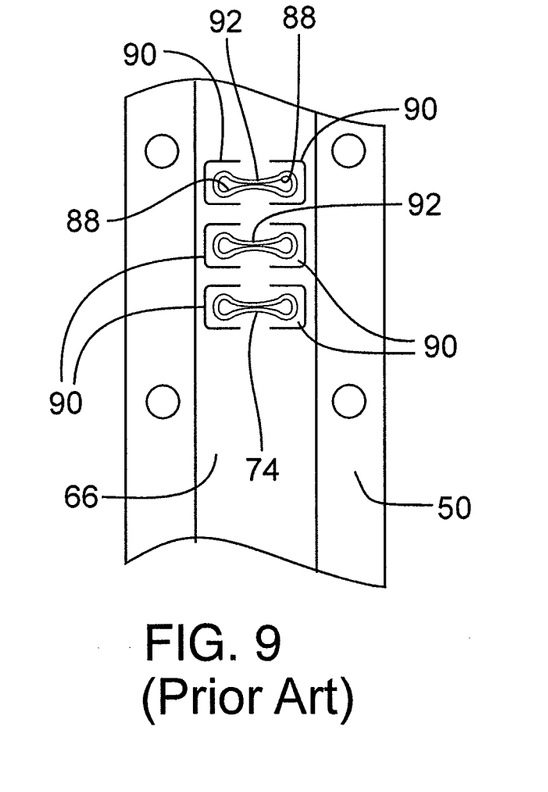
FIG. 9 is a diagram of a mask in which apertures of a dog bone or bow tie shape are cut.

FIGS. 7A, 7B, and 9 show masks 66 having second apertures 74 of different geometries. Mask 66 of FIG. 7A includes a series of closely spaced second apertures 74 of round shape. These second apertures 74 include a single, closed curvilinear side margin 78.

Mask 66 of FIG. 7B includes two second apertures 74 of "sawtooth" shape, each of which is capable of holding multiple electronic components. Each sawtooth-shaped second aperture 74 is an elongated aperture having multiple side margins 78 that form multiple resilient teeth 82 that extend into second aperture 74, as is more fully described in U.S. Pat. No. 5,226,382. The arrangement of side margins 78 of sawtooth-shaped second aperture 74 forms multiple individual openings 80, each of which is capable of holding a single electronic component.

Mask 66 of FIG. 9 includes multiple second apertures 74 of a "dog bone" or "bow tie" shape and including opposed side margins 88 separated along their lengths by longer distances at opposite ends 90 and by a shorter distance at a medial location 92 between ends 90. In a preferred embodiment, the slot distances become gradually smaller from opposite ends 90 to medial location 92.

An array electronic component is held in the second aperture under compression by an interference fit. For example, a 0.05 mm (0.002 in) desired interference fit nominally requires a ±0.025 mm (±0.001 in) second aperture tolerance range, and a 0.51 mm (0.02 in) thick array electronic component typically requires a 0.43-0.48 mm (0.017-0.019 in) second aperture. A less than −0.025 mm (−0.001 in) second aperture width tolerance results in a second aperture that is too tight, causing the silicone rubber nubs of the second aperture to deflect (rather than compress) and thereby cant the array electronic component held in the second aperture. A second aperture opening width of greater than 0.025 mm (0.001 in) lets the component fall out of the belt.

When loaded, individual electronic components must be centered in two directions (horizontally and vertically) within a second aperture. Currently available loading techniques require two processing steps to correctly position an electronic component within each second aperture. First, an electronic component is loaded into a second aperture such that the electronic component is centered in only one direction, typically horizontally. Second, the electronic component is centered between the top and bottom exterior surfaces of the mask. Exemplary secondary operations include, for example, (1) exposing the electronic component to a high-pressure gust of air that forces the electronic component into the desired alignment and (2) mechanically pushing the electronic component into the desired alignment, as described in U.S. Pat. Nos. 5,863,331 and 5,226,382. Both of these exemplary secondary operations involve contact with the loaded electronic component. Further, because of the tight fit of the electronic component in the second aperture, a significant amount of force is required to center the electronic component. Consequently, the secondary operation often results in mechanical damage to the loaded component. Further, the secondary operation is an additional processing step that requires the use of additional machinery and increases processing time for each electronic component.

Also, some of the prior art second aperture geometries, e.g., the sawtooth formation shown in FIG. 7B, do not consistently hold electronic components in the desired orientation, causing them to move during processing and thereby reducing the overall yield of usable electronic components. With specific reference to the sawtooth formation shown in FIG. 7B, this is so because each of the individual openings that comprise the elongated second aperture have incongruous side margins and thus lack sufficient aperture side margin grip to tightly and securely hold multiple electronic components.

Additionally, because the second apertures are shaped such that the sides of the electronic component tightly contact the side margins of the second aperture, the electrically conductive portions of the electronic components can be damaged during processing. Further, removing the terminated electronic components from the second apertures as shown in U.S. Pat. No. 5,863,331 requires a significant amount of force because of the tight fit necessary to hold the electronic component in the desired orientation during processing. This force can mechanically damage the terminated electronic component, thereby reducing the overall yield of usable electronic components. Further, during the receipt, gripping, positioning, and ejection processes, the terminated electronic component may be subject to smearing of the conductive stripes 42 as the electronic components slide along the side margins of the second aperture, which degrades the finished component's performance.

In the case of using a round second aperture 74, as shown in FIG. 7A, the side margins of the second aperture tightly contact the side and end wall surfaces of the electronic component, and any previously formed electrically conductive stripes on the electronic components can be damaged during receipt of the electronic component into the second aperture. Further, the method of removing the terminated electronic components from the second apertures described in U.S. Pat. No. 5,863,331 requires a significant amount of force because of the tight fit necessary to hold the electronic component in the desired orientation during processing. Application of this force can result in mechanical damage to the terminated electronic component, thereby reducing the overall yield of usable electronic components. Further, the terminated electronic component may be subject to smearing of the conductive stripes as they slide along the side margins of the second aperture.

What is needed, therefore, is a mask including miniature component apertures capable of receiving in a single step miniature electronic components and of gripping them in a controlled orientation during termination of the ends of the electronic components without damaging their electrically conductive portions.

SUMMARY OF THE DISCLOSURE

A miniature electronic component carrier capable of receiving and holding multiple miniature components includes a thin, resilient mask through which are formed multiple spaced-apart apertures each of which has a periphery that is sized and shaped to compliantly receive and grip a miniature electronic component in a controlled orientation during termination processing. This controlled orientation ensures that the electronic component surfaces intended for termination (e.g., the upper and lower surfaces of a chip capacitor and the side wall surfaces of a chip array) extend outwardly from the mask. In some embodiments, the apertures have peripheries that form rhomboidal or elliptical apertures. The shapes of the peripheries of these apertures facilitate placement of a miniature electronic component in each aperture such that component holding regions of the periphery of the aperture contact and grip primarily the corner regions of the miniature electronic component. The shapes and sizes of the peripheries of the multiple spaced-apart apertures confine gripped electronic components by contact within an operational tolerance with any one of the side and end wall surfaces of the electronic components to prevent mechanical damage to the side and end wall surfaces resulting from their contact with the peripheries during receipt, gripping, positioning, and ejection of the miniature electronic components.

Some embodiments of the miniature electronic component carrier may also include one or more relief openings that extend from or are adjacent to the apertures. The relief openings facilitate temporary deformation of the resilient mask during receipt and gripping of a miniature electronic component. One exemplary type of relief opening is a slot that extends outwardly from a vertex of a rhomboidal aperture. Another exemplary type of relief opening includes one or more relief opening side margins that form a square, rectangular, circular, triangular, elliptical, trapezoidal, curved, or semicircular relief opening. This type of relief opening is positioned adjacent to a side margin of a rhomboidal or elliptical aperture.

Additional aspects and advantages will be apparent from the following detailed description of preferred embodiments, which proceeds with reference to the accompanying drawings.

DETAILED DESCRIPTION OF PREFERRED EMBODIMENTS

When used in reference to a mask, the term "apertures" refers to the above-described second apertures. Preferred embodiments of a miniature component carrier include a thin, resilient mask through which are formed multiple spaced-apart apertures each of which has a periphery that is sized and shaped to compliantly receive and grip the corner regions of a miniature electronic component. Gripping the corner region limits contact between component holding regions of the periphery of each aperture and the side and end wall surfaces of each gripped electronic component. Limiting such contact reduces mechanical damage to the side and end wall surfaces resulting from their contact with the periphery during receipt, gripping, positioning, and ejection of the miniature component. The shape and size of each aperture also ensure that the electronic component gripped and held by the aperture maintains a controlled orientation during termination processing. This controlled orientation ensures that the surfaces intended for termination (i.e., the upper and lower surfaces of a capacitor chip and the side wall surfaces of an array chip) extend outwardly from the mask. Exemplary aperture shapes that facilitate receipt and grip of the corner regions of a miniature electronic component include substantially rhomboidal and elliptical apertures.

Figure 10:
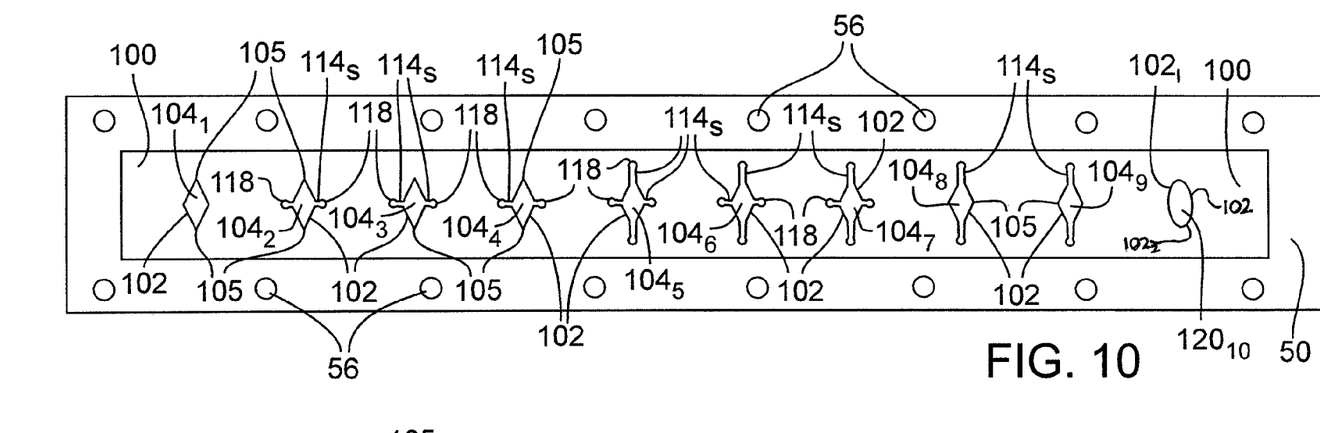
FIG. 10 is a plan view of a carrier tape that includes a mask in which multiple apertures of varying geometries have been formed.

FIG. 10 shows a mask 100 that includes multiple apertures of various geometries. Skilled persons will recognize that, in practice, masks for use in miniature component carriers typically include multiple apertures having a single geometry. The depiction in FIG. 10 of a carrier tape having apertures of various geometries is meant to show some exemplary embodiments of apertures that may be formed in mask 100.

Figure 11:
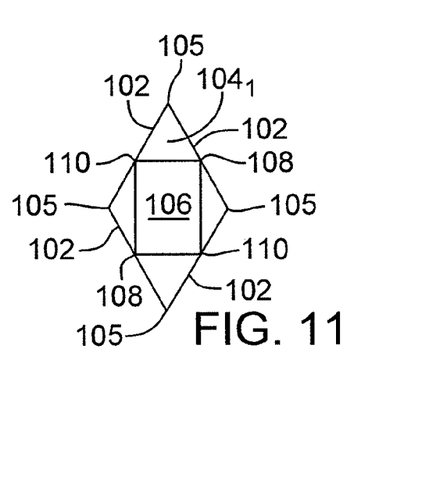
FIGS. 11 and 12 are enlarged plan views of rectangular electronic components seated within, respectively, the rhomboidal and elliptical apertures shown at opposite ends of the carrier tape of FIG. 10.

A leftmost aperture $104_1$ in mask 100 has four linear side margins 102 that form a rhomboidal aperture 104 having four vertices 105. The term "rhomboidal" refers to a parallelogram with unequal adjacent sides, such as a rhombus, diamond, or rhomboid. FIG. 11 is an enlarged plan view of an electronic component 106 seated within rhomboidal aperture $104_1$ of FIG. 10. A portion of each aperture side margin 102 forms a linear holding region 108 where aperture side margin 102 contacts a corner region 110 of electronic component 106. As stated above, corner region 110 is a linear region along which two edges of any of the surfaces (e.g., upper, lower, side wall, or end wall surfaces) of electronic component 106 meet and form an angle. Corner region 110 may include the point at which three of the edges meet, such as, for example, the point at which an edge of the upper surface meets an edge of a side wall surface and an edge of an end wall surface. In addition to contacting corner region 110, holding region 108 may contact a minimal portion (e.g., 7%) of side wall surfaces 22 and 24 and/or end wall surfaces 26 and 28 of electronic component 106. The 7% overlap of holding region 108 and side wall surfaces 22 and 24 and/or end wall surfaces 26 and 28 represents an operational tolerance beyond which undesirable damage to the side and end wall surfaces of the electronic component may result. An overlap of greater than 7% will result in excessive interference between holding region 108 and stripes 42.

When seated in rhomboidal aperture $104_1$, electronic component 106 places mechanical stress or pressure on holding regions 108 of side margins 102. To reduce the amount of mechanical stress on holding regions 108, relief openings 114 provided in mask 100 facilitate temporary deformation of mask 100 during receipt and gripping of miniature electronic component 106. Apertures $104_2$-$104_9$ shown in FIG. 10 include relief openings 114. Relief openings $114_s$ shown in FIG. 10 are slots that extend outwardly from at least one of vertices 105 of rhomboidal aperture 104. The length of each slot-type relief opening $114_s$ is preferably between about 10% and 100% of the length of one of side margins 102. In the embodiments shown in FIG. 10, slot-type relief openings $114_s$ include a bulbous hole 118. Slot-type relief openings $114_s$ may be formed without bulbous hole 118. Although each of apertures $104_2$-$104_9$ shown in FIG. 10 includes multiple slot-type relief openings $114_s$, some embodiments of aperture 104 may include only a single slot-type relief opening $114_s$. In embodiments where an even number of slot-type relief openings $114_s$ are present, they preferably extend from opposed vertices 105 of aperture 104.

Figure 12:
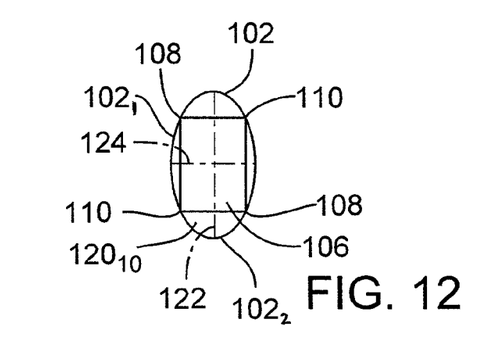

A rightmost aperture $120_{10}$ shown in FIG. 10 includes curved side margins $102_1$ and $102_2$ that are of convex shape curving outward relative to the aperture interior and are portions of a single, closed curvilinear side margin 102 that forms an elliptical aperture 120 having a major axis 122 and a minor axis 124 (shown in FIG. 12). Elliptical aperture $120_{10}$ has sufficient eccentricity to confine within the operational tolerance described above contact between side margins 102 of aperture 120 and side wall surfaces 22 and 24 and end wall surfaces 26 and 28 of electronic component 106. Some embodiments of elliptical apertures 120 are of a rhomboidal-ellipsis shape. FIG. 12 is an enlarged diagram of electronic component 106 seated within elliptical aperture $120_{10}$ of FIG. 10. Portions of side margin 102 of elliptical aperture 120 form holding regions 108 where aperture side margin 102 contacts corner region 110 of electronic component 106. As stated above, in addition to contacting corner region 110, holding region 108 may contact a minimal portion (e.g., 7%) of side wall surfaces 22 and 24 and/or end wall surfaces 26 and 28 of electronic component 106.

Figure 13A:
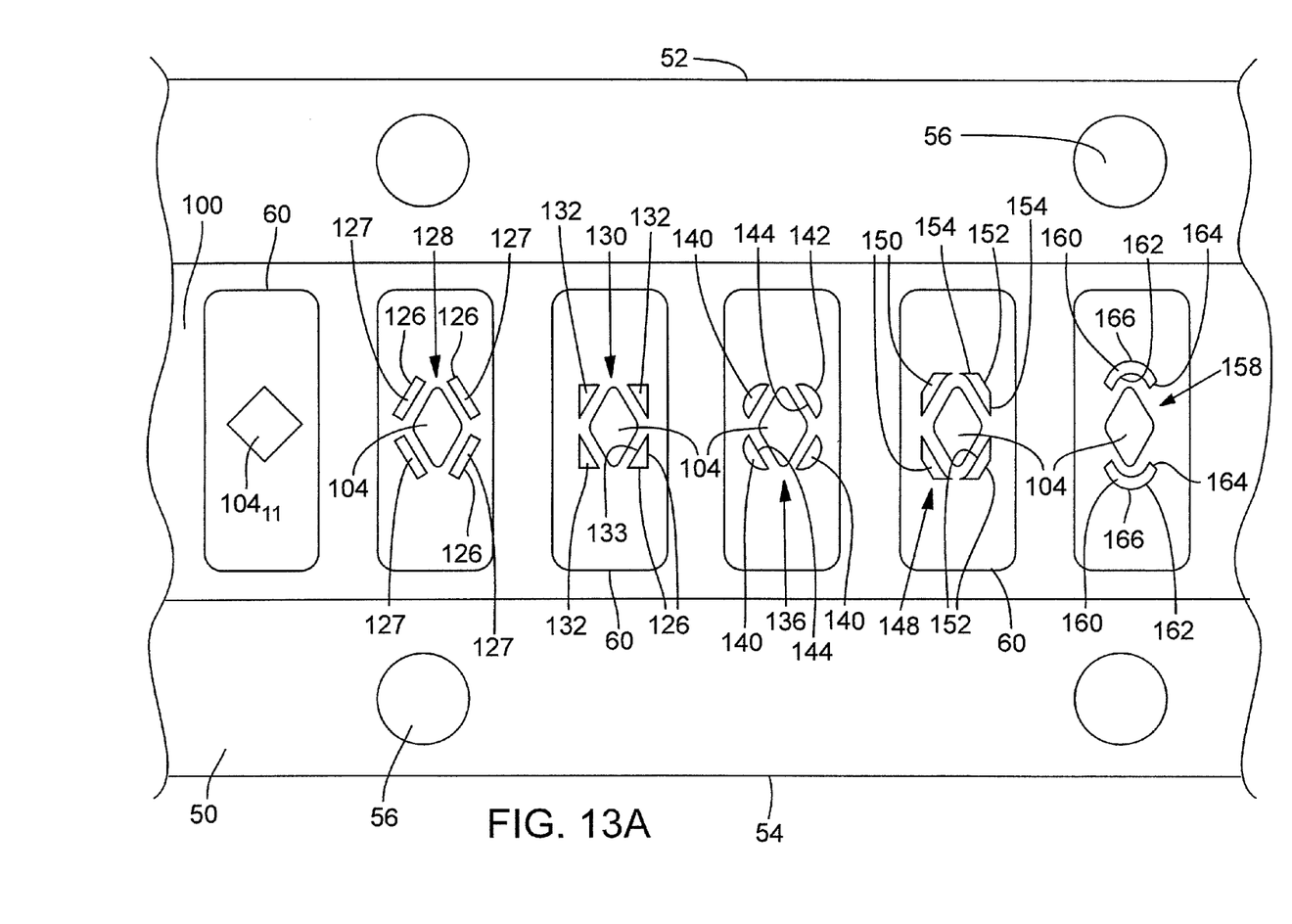
FIGS. 13A and 13B are enlarged fragmentary plan views of a carrier tape including a mask in which multiple apertures and relief openings of varying geometries have been formed.
Figure 13B:
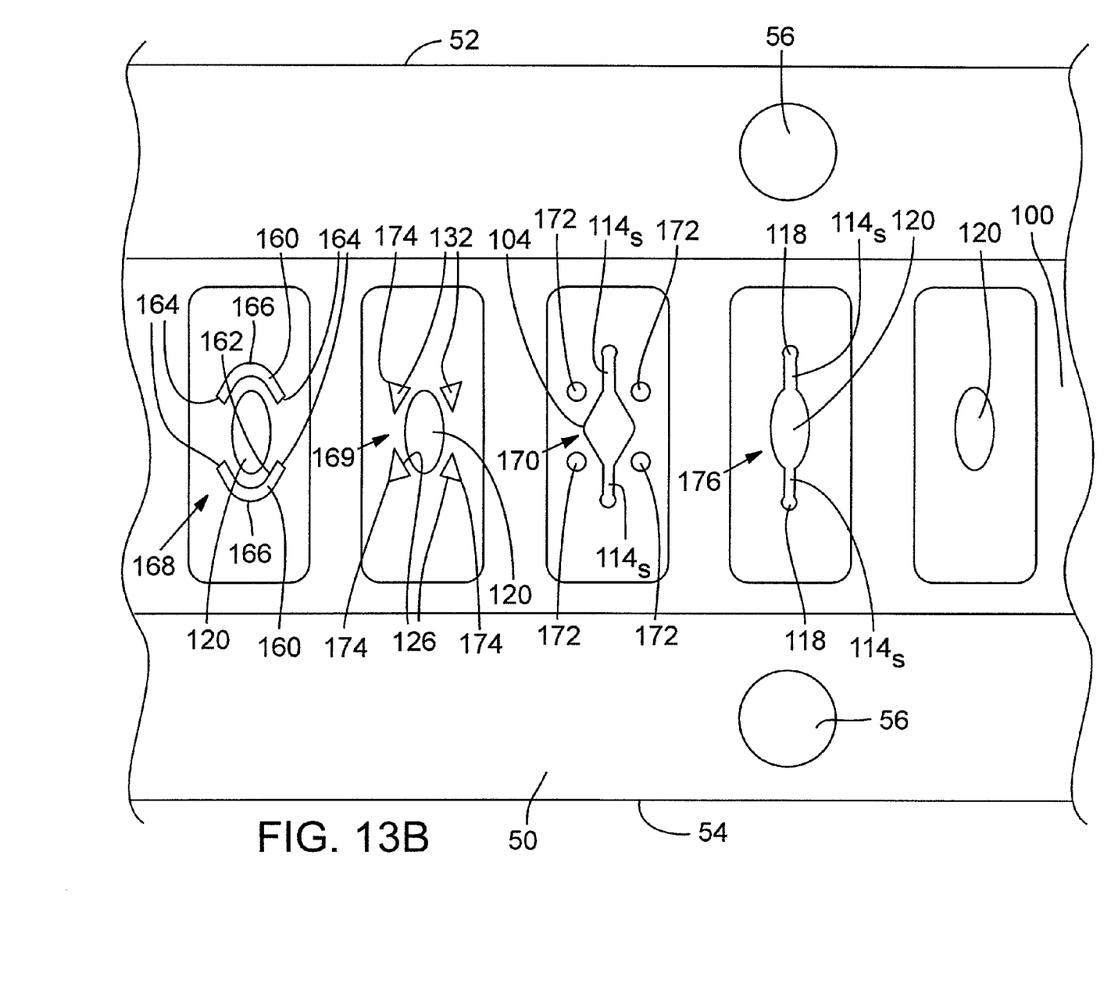

FIGS. 13A and 13B show masks 100 that include multiple aperture/relief opening combinations each of which have a different geometry. As stated above, skilled persons will recognize that, in practice, masks for use in miniature component carriers typically include a single aperture/relief opening geometry. The depiction in FIGS. 13A and 13B of a carrier tape having aperture/relief opening combinations of various geometries is meant to show some exemplary aperture/relief opening combinations that may be formed in mask 100. The exemplary relief openings shown in FIGS. 13A and 13B include relief opening side margins that form, for example, square, rectangular, circular, triangular, elliptical, semicircular, curved, and trapezoidal relief openings. Any of the exemplary relief openings shown in FIGS. 13A and 13B may be positioned adjacent to at least one side margin 102 or vertex 105 of either of rhomboidal aperture 104 or elliptical aperture 120. Skilled persons will recognize that additional relief opening geometries that are not shown in FIGS. 13A and 13B may be formed.

To reduce the number of reference numerals shown in FIGS. 13A and 13B, reference numerals 102 (referring to the aperture side margins) and 105 (referring to a vertex of a rhomboidal aperture) are not shown.

A leftmost aperture $104_{11}$ in mask 100 of FIG. 13A has four linear side margins 102 that form a rhomboidal aperture 104. Aperture $104_{11}$ does not include any relief openings.

An aperture/relief opening combination 128 in mask 100 of FIG. 13A includes an aperture that has four linear side margins 102 and four rounded vertices 105 that form a substantially rhomboidal aperture 104. Adjacent to each side margin 102 is a rectangular relief opening 127. Each of the four rectangular relief openings 127 includes four linear relief opening side margins 126, one of which is positioned adjacent to a linear side margin 102 of aperture 104. In some embodiments, the length of each relief opening side margin 126 is equal to or less than the length of each side margin 102. Skilled persons will recognize that rectangular relief openings 127 may be square relief openings. Further, skilled persons will recognize that substantially rhomboidal aperture 104 may be replaced with elliptical aperture 120.

An aperture/relief opening combination 130 in mask 100 of FIG. 13A includes an aperture that has four linear side margins 102 and four rounded vertices 105 that form a substantially rhomboidal aperture 104. Adjacent to each side margin 102 is a triangular relief opening 132. Each of triangular relief openings 132 includes three linear relief opening side margins 126 that form a right triangle whose hypotenutical side margin 133 is positioned adjacent to a linear side margin 102 of aperture 104. Skilled persons will recognize that triangular relief openings 132 are not limited to right triangles and that any of the legs of triangular relief openings 132 may be positioned adjacent to side margins 102 of aperture 104. Further, skilled persons will recognize that substantially rhomboidal aperture 104 may be replaced with elliptical aperture 120.

An aperture/relief opening combination 136 in mask 100 of FIG. 13A includes an aperture that has four linear side margins 102 and four rounded vertices 105 that form a substantially rhomboidal aperture 104. Adjacent to each side margin 102 is a semicircular relief opening 140. Each of the four semicircular relief openings 140 includes a curvilinear relief opening side margin 142 and a linear relief opening side margin 144. Linear relief opening side margin 144 is positioned adjacent to linear side margin 102 of aperture 104. Skilled persons will recognize that curvilinear relief opening side margin 142 may be positioned adjacent to linear side margin 102 of aperture 104 and that substantially rhomboidal aperture 104 may be replaced with elliptical aperture 120.

An aperture/relief opening combination 148 in mask 100 of FIG. 13A includes an aperture that has four linear side margins 102 and four rounded vertices 105 that form a substantially rhomboidal aperture 104. Adjacent to each side margin 102 is a generally trapezoidal relief opening 150. Each of the four trapezoidal relief openings 150 includes two spaced-apart, parallel relief opening side margins 152 and two end relief opening side margins 154. As shown in FIG. 13A, the longer of the two spaced-apart, parallel relief opening side margins 152 is positioned adjacent to linear side margins 102 of substantially rhomboidal aperture 104. Skilled persons will recognize that either of the parallel side margins 152 or either of the end relief opening side margins 154 may be positioned adjacent to side margins 102. Further, skilled persons will recognize that substantially rhomboidal aperture 104 may be replaced with elliptical aperture 120.

An aperture/relief opening combination 158 in mask 100 of FIG. 13A includes an aperture that has four linear side margins 102 and four rounded vertices 105 that form a substantially rhomboidal aperture 104. Adjacent to each of two opposed vertices 105 is a curved, or arc-shaped, relief opening 160. Each of the two curved relief openings 160 includes two curvilinear relief opening side margins 162, two end relief opening side margins 164, and an apex region 166. Apex region 166 of each curved relief opening 160 is positioned adjacent to opposed ones of vertices 105. Skilled persons will recognize that curvilinear relief opening side margins 162 may be positioned in other locations, such as, for example, adjacent to linear side margins 102 of substantially rhomboidal aperture 104 and adjacent to each of vertices 105 of substantially rhomboidal aperture 104.

An aperture/relief opening combination 168 in mask 100 of FIG. 13B includes elliptical aperture 120 and two curved relief openings 160 positioned adjacent to curvilinear side margin 102. Each of the curved relief openings 160 includes two curvilinear relief opening side margins 162, two end relief opening side margins 164, and an apex region 166. Each curved relief opening 160 is positioned adjacent to side margin 102 of aperture 120 such that major axis 122 (not shown) intersects apex region 166 of each curved relief opening 160. Skilled persons will recognize that curvilinear relief opening side margins 162 may be positioned in other locations, such as, for example, intersecting minor axis 124 (not shown) of elliptical aperture 120.

An aperture/relief opening combination 169 in mask 100 of FIG. 13B includes elliptical aperture 120 and four triangular relief openings 132 positioned adjacent to curvilinear side margin 102. One of the three linear relief opening side margins 126 of each of the four triangular relief openings 132 is positioned adjacent to a curvilinear side margin 102 of aperture 120. Further, triangular relief openings 132 are positioned such that they intersect neither major axis 122 (not shown) nor minor axis 124 (not shown) of elliptical aperture 120. Skilled persons will recognize that triangular relief openings 132 may be positioned along either or both of major and minor axes 122 and 124 (not shown) and that a vertex 174 of each triangular relief opening may be positioned adjacent to side margins 102 of aperture 120.

An aperture/relief opening combination 170 in mask 100 of FIG. 13B includes an aperture that has four linear side margins 102 and two opposed rounded vertices 105 that form a substantially rhomboidal aperture 104. Adjacent to each side margin 102 is a circular relief opening 172. Each of the four circular relief openings 172 is positioned adjacent to a different one of the four linear side margins 102 of substantially rhomboidal aperture 104. Also, two slot-type relief openings $114_s$ extend from opposed vertices 105 of substantially rhomboidal aperture 104. Skilled persons will recognize that slot-type relief openings $114_s$ may extend from fewer or more of vertices 105 and that substantially rhomboidal aperture 104 may be replaced with elliptical aperture 120.

An aperture/relief opening combination 176 in mask 100 of FIG. 13B includes elliptical aperture 120 and two slot-type relief openings $114_s$ extending generally along major axis 122 (not shown) of elliptical aperture 120. Each of the two slot-type relief openings $114_s$ includes bulbous hole 118 on their ends. The right-most aperture in mask 100 of FIG. 13B is an elliptical aperture 120 without a relief opening.

Apertures 104 and 120 may be formed in mask 100 by laser processing, molding, and die punching. One exemplary method of laser processing is described in U.S. Pat. No.

6,919,532, which is assigned to the assignee of the present application. In this method of laser processing, an ultraviolet (UV) laser beam is directed to cut through a component carrier mask made of thin elastomeric material to form apertures having the desired shape and size. A preferred embodiment uses a UV laser beam to form by ablation multiple apertures in a resilient mask made of elastomeric material. Ablation of the elastomeric material, which is preferably silicone rubber, ensures formation of apertures of the required shape and dimensional quality. The absorption of conventional elastomeric materials, including silicone rubber, at the UV laser ablation wavelength region (shorter than about 400 nm) is insufficiently strong to cut apertures at commercially acceptable throughput rates. To overcome this drawback, preferred methods of UV laser processing entail introducing a light absorptivity enhancement material into the silicone rubber to form a flexible support blank that operationally adequately absorbs light within a laser ablation wavelength region, and using a UV laser beam to cut the apertures. Iron oxide and titanium dioxide are preferred dye dopants that function as light absorptivity enhancement materials.

Figure 14:
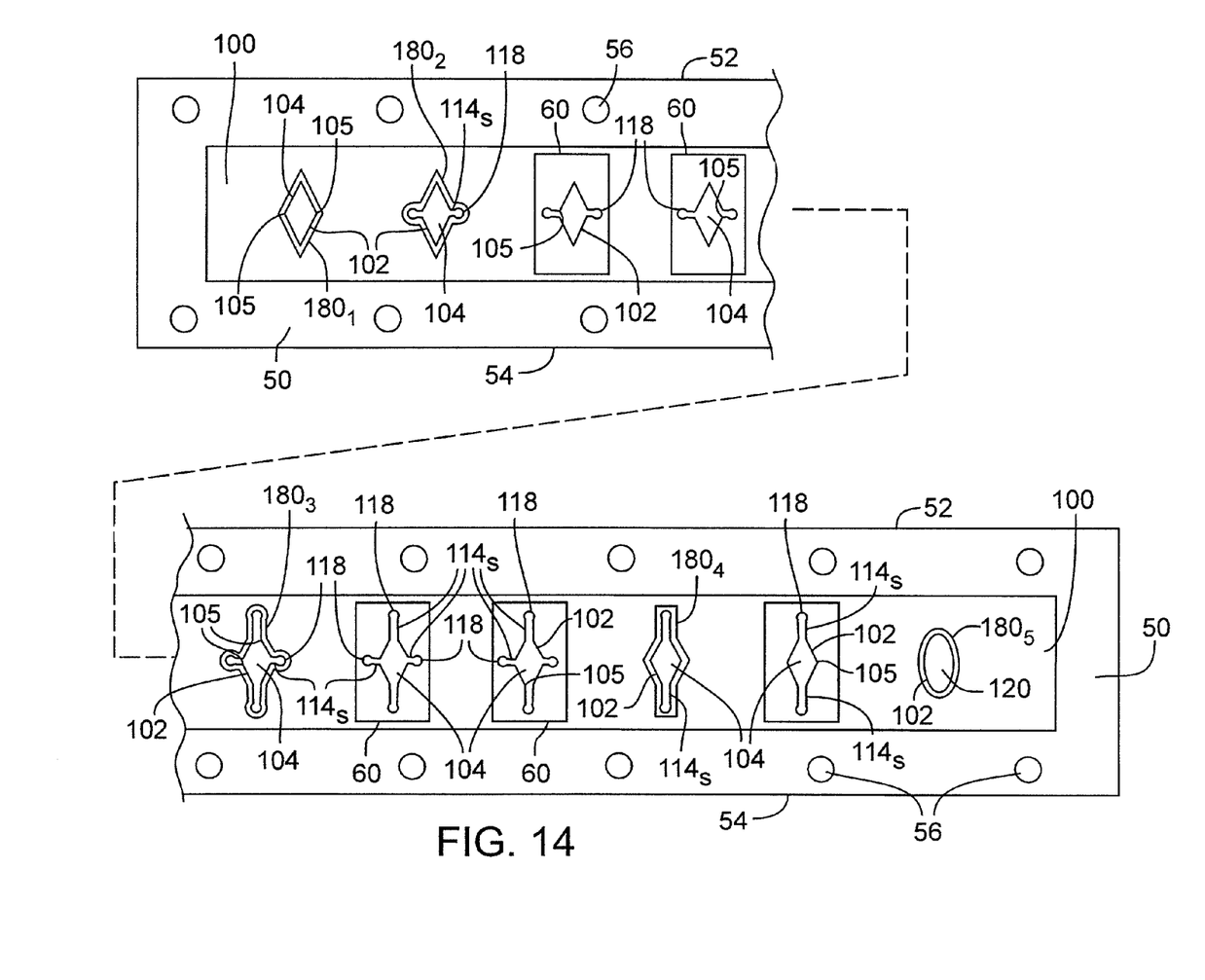
FIG. 14 is a plan view of a carrier tape that includes a transparent mask, each of the carrier tape and the transparent mask having multiple apertures formed in them.

FIG. 14 is a plan view of carrier tape 50 including transparent mask 100. Each one of carrier tape 50 and transparent mask 100 has multiple apertures formed in them. The apertures formed in mask 100 are second apertures (referred to above as apertures 104 and 120), and the apertures formed in tape 50 are first apertures (as described in the Background Information section). As shown in FIG. 14, some embodiments of first apertures 180 of tape 50 have geometries similar to the above-described geometries of apertures 104 and 120. Further, the general shapes of first apertures 180 may outline the shape of slot-type relief openings 114$_s$ where such relief openings extend from apertures 104 and 120.

As shown by the leftmost first aperture 180$_1$ in tape 50 of FIG. 14, an exemplary first aperture 180$_1$ has a generally rhomboidal shape that is similar to, or outlines, the shape of rhomboidal aperture 104 in mask 100. In some embodiments, rhomboidal aperture 104 of mask 100 is positioned directly above first rhomboidal aperture 180$_1$. As shown in FIG. 14, rhomboidal-shaped first aperture 180$_1$ lies below and has a greater area than that of rhomboidal aperture 104.

First aperture 180$_2$ in tape 50 of FIG. 14 has a generally rhomboidal shape that includes the outline of two slot-type relief openings 114$_S$ that form a portion of second aperture 104 that lies above first aperture 180$_2$. First apertures 60 shown in FIG. 14 are prior art rectangular first apertures.

First aperture 180$_3$ shown in FIG. 14 has a generally rhomboidal shape that includes the outline of four slot-type relief openings 114$_s$ that extend from each of vertices 105 of second aperture 104 and that each include a bulbous hole 118.

First aperture 180$_4$ of FIG. 14 has a generally rhomboidal shape that includes the outline of two slot-type relief openings 114$_S$ forming a portion of second aperture 104 that lies above first aperture 180$_4$.

A rightmost first aperture 180$_5$ is an elliptical-shaped aperture whose shape generally outlines the shape of elliptical aperture 120 in mask 100. First aperture 180$_5$ is positioned directly below elliptical aperture 120. As shown in FIG. 14, elliptical first aperture 180$_5$ has a greater area than that of elliptical aperture 120.

Skilled persons will recognize that first apertures 180 may have shapes other than rhomboidal and elliptical and can include relief opening geometries other than those shown in FIG. 14.

Some embodiments of masks 100 may be acceptable for use in a Model 752B Automatic Termination System or a Model 332 High Throughput Discrete Termination System, both of which are manufactured by Electro Scientific Industries, Inc. of Portland, Oreg. (the assignee of the present application).

As one skilled in the art will appreciate in light of this disclosure, certain embodiments are capable of achieving certain advantages over the known prior art, including some or all of the following. Miniature electronic components can be tightly held in a desired orientation without significant mechanical damage (1) to the electrically conductive portions of the electronic component and/or (2) to the termination paste that is applied to the electronic component during electronic component processing. The inclusion of relief openings in the mask extends the life of the mask because the relief openings relieve some of the mechanical stress on the side margins of the apertures. Also, the relief openings enhance the flexibility of the mask and thereby facilitate receipt and grip of electronic components having varying geometries and dimensions.

It will be obvious to those having skill in the art that many changes may be made to the details of the above-described embodiments without departing from the underlying principles of the invention. The scope of the present invention should, therefore, be determined only by the following claims.

The invention claimed is:

1. A miniature component carrier including a thin, resilient mask through which are formed multiple spaced-apart elongated apertures that are sized and shaped to compliantly receive and hold multiple miniature electronic components in a controlled orientation, the electronic components having applied electrically conductive material, each electronic component having opposed upper and lower surfaces spaced apart by a component thickness bound by opposed side wall surfaces and opposed end wall surfaces, and each electronic component further having multiple corner regions in which one of the upper surface or the lower surface meets at least one of a side wall surface and an end wall surface, comprising:

each of the multiple spaced-apart elongated apertures having a periphery, a major axis, and a minor axis, wherein the major axis has a major axis length that is longer than a minor axis length of the minor axis, each periphery defining an aperture interior and shaped to compliantly receive and hold one of the electronic components, each periphery including side margins of convex shape curving outward relative to the aperture interior and converging to form vertices having opposite rounded end portions that face outwardly from each other, each periphery including component holding regions that contact and grip primarily the corner regions of an electronic component received by the aperture, and each periphery configured to grip the received electronic component in a controlled orientation and confine the gripped electronic component by contact within an operational tolerance with any one of the side and end wall surfaces to prevent damage to the applied electrically conductive material during ejection of the gripped electronic component from the aperture.

2. The component carrier of claim 1, in which the side margins of convex shape form a substantially rhomboidal aperture.

3. The component carrier of claim 1, in which the side margins of convex shape are portions of a closed curvilinear side margin that forms an elliptical aperture having sufficient eccentricity to confine within the operational tolerance contact with any one of the side and end wall surfaces.

4. The component carrier of claim 1, in which the each periphery is configured to prevent smearing the applied electrically conductive material during insertion and extraction of the electronic component from the aperture.

5. The component carrier of claim 1, further including a flexible metal tape having multiple holes that are sized and shaped to compliantly receive and hold the resilient mask.

6. The component carrier of claim 1, in which the miniature component is one of a chip capacitor and an integrated passive electronic component.

7. The component carrier of claim 1, in which one holding region of the aperture is operable to overlap 7% or less of one side wall surface or one end wall surface of one of the miniature electronic components.

8. The component carrier of claim 1, in which the vertices are oriented in a direction transverse to the minor axis.

9. A miniature component carrier capable of receiving and holding multiple miniature components, each miniature component including opposed upper and lower surfaces spaced apart by a component thickness bound by opposed side wall surfaces and opposed end wall surfaces, and each miniature component further including multiple corner regions defined by intersection of one of the upper surface or the lower surface with at least one of a side wall surface and an end wall surface, comprising:

a thin, resilient mask through which is formed multiple spaced-apart apertures each of which has a periphery that defines an aperture interior and is sized and shaped to compliantly receive and grip a miniature component in a controlled orientation, at least some of the apertures having peripheries that each include side margins of convex shape curving outward relative to the aperture interior and converging to form vertices having opposite rounded end portions that face outwardly from each other to form one of a substantially rhomboidal or elliptical aperture, each periphery that includes side margins of convex shape also including a major axis and a minor axis wherein the major axis has a major axis length that is longer than a minor axis length of the minor axis, each periphery that includes side margins of convex shape including component holding regions that contact and grip primarily the corner regions of a miniature component received by the aperture, and each periphery that includes side margins of convex shape configured to grip the received miniature component in a controlled orientation and confine the gripped miniature component by contact within an operational tolerance with any one of the side and end wall surfaces to prevent damage to the miniature component during its ejection from the aperture.

10. The component carrier of claim 9, in which the thin, resilient mask further includes a relief opening that extends from one of the apertures, the relief opening facilitating temporary deformation of the resilient mask during receipt and gripping of the miniature component.

11. The component carrier of claim 10, in which the relief opening is a slot that extends outwardly from one of a vertex of the substantially rhomboidal aperture and a major axis of the elliptical aperture.

12. The component carrier of claim 9, in which the miniature component is one of a chip capacitor and an integrated passive electronic component.

13. The component carrier of claim 9, further including a flexible metal tape having multiple holes that are sized and shaped to compliantly receive and hold the resilient mask.

14. The component carrier of claim 9, in which one holding region of the aperture is operable to overlap 7% or less of one side wall surface or one end wall surface of one of the miniature electronic components.

15. The component carrier of claim 9, in which the vertices are oriented in a direction transverse to the minor axis.

16. A miniature component carrier including a thin, resilient mask through which are formed multiple spaced-apart elongated apertures that are sized and shaped to compliantly receive and hold multiple miniature electronic components in a controlled orientation, the electronic components having applied electrically conductive material and being one of a chip capacitor and an integrated passive electronic component, each electronic component having opposed upper and lower surfaces spaced apart by a component thickness bound by opposed side wall surfaces and opposed end wall surfaces, and each electronic component further having multiple corner regions in which one of the upper surface or the lower surface meets at least one of a side wall surface and an end wall surface, comprising:

each of the multiple spaced-apart elongated apertures having a periphery, a major axis, and a minor axis, wherein the major axis has a major axis length that is longer than a minor axis length of the minor axis, each periphery defining an aperture interior and shaped to compliantly receive and hold one of the electronic components, each periphery including side margins of convex shape curving outward relative to the aperture interior and converging to form vertices having opposite rounded end portions that face outwardly from each other to form a substantially rhomboidal or elliptical aperture having sufficient eccentricity to confine within an operational tolerance contact with any one of the side and end wall surfaces to prevent damage to the applied electrically conductive material, each periphery including component holding regions that contact and grip primarily the corner regions of an electronic component received by the aperture, and each periphery configured to grip the received electronic component in a controlled orientation and confine the gripped electronic component by contact within the operational tolerance with any one of the side and end wall surfaces to prevent damage to the applied electrically conductive material during ejection of the gripped electronic component from the aperture.

17. The component carrier of claim 16, in which one holding region of the aperture is operable to overlap 7% or less of one side wall surface or one end wall surface of one of the miniature electronic components.

18. The component carrier of claim 16, in which the vertices are oriented in a direction transverse to the minor axis.

19. The component carrier of claim 16, further including a flexible metal tape having multiple holes that are sized and shaped to compliantly receive and hold the resilient mask.

20. The component carrier of claim 16, in which the miniature component is one of a chip capacitor and an integrated passive electronic component.

* * * * *